United States Patent [19]

Nozue

[11] Patent Number: 5,432,587
[45] Date of Patent: Jul. 11, 1995

[54] EXPOSING DEVICE CAPABLE OF MAKING CLEAR PATTERN IMAGE ON PHOTO RESIST LAYER HAVING DIFFERENT LEVEL SURFACES

[75] Inventor: Hiroshi Nozue, Tokyo, Japan
[73] Assignee: NEC Corporation, Tokyo, Japan
[21] Appl. No.: 183,805
[22] Filed: Jan. 21, 1994
[30] Foreign Application Priority Data Jan. 20, 1993 [JP] Japan ................................ 5-007118
Sep. 24, 1993 [JP] Japan ................................ 5-237101

[51] Int. Cl.6 ........................ G03B 27/42; G03B 27/54
[52] U.S. Cl. ............................................. 355/53; 355/55
[58] Field of Search ...................... 355/53, 55; 359/778

[56] References Cited

U.S. PATENT DOCUMENTS

| | | | |
|---|---|---|---|
| 4,688,904 | 8/1987 | Hirose et al. | 350/443 |
| 4,891,663 | 1/1990 | Hirose | 355/53 |
| 4,937,619 | 6/1990 | Fukuda et al. | 355/53 |
| 4,965,630 | 10/1990 | Kato et al. | 355/52 |
| 4,977,426 | 12/1990 | Hirose | 355/53 |
| 5,105,075 | 4/1992 | Ohta et al. | 250/201.2 |
| 5,117,255 | 5/1992 | Shiraishi et al. | 355/53 |
| 5,311,362 | 5/1994 | Matsumoto et al. | 359/738 |

OTHER PUBLICATIONS

Patent Abstracts of Japan, vol. 9, No. 13 (P-328), Jan. 19, 1985.

Primary Examiner—Richard A. Wintercorn
Attorney, Agent, or Firm—Sughrue, Mion, Zinn, Macpeak & Seas

[57] ABSTRACT

A reticle (25) is displaceably supported in an optical axis relative to a reticle pattern image (33). When the reticle is displaced, a pattern image (35) has a negative longitudinal spherical aberration. The pattern image is clear on a photo resist layer on a wafer (37) that has a central surface and a side surface which is lower than the central surface. A first transparent parallel-plate may be removably placed between the reticle and the wafer. The first transparent parallel-plate gives a positive longitudinal spherical aberration of the pattern image. A second transparent parallel-plate may be movably placed between the reticle and the wafer. The second transparent parallel-plate gives a negative longitudinal spherical aberration to the pattern image.

4 Claims, 8 Drawing Sheets

EXPOSING DEVICE CAPABLE OF MAKING CLEAR PATTERN IMAGE ON PHOTO RESIST LAYER HAVING DIFFERENT LEVEL SURFACES

BACKGROUND OF THE INVENTION

This invention relates to an exposing device for producing a pattern image representative of a pattern on a reticle to irradiate the pattern image to a photo resist layer on a wafer on manufacturing a semiconductor device.

In the manner which will later be described more in detail, a conventional exposing device comprises an illuminating source, an illuminating optical system, a reticle, and a reducing optical system.

The illuminating optical system receives rays from the illuminating source to produce parallel rays. The reticle has a pattern. The reticle receives the parallel rays from the illuminating optical system to produce a reticle pattern image representative of the pattern. The reducing optical system reduces the reticle pattern image to produce a reduced pattern image as a pattern image. The pattern image is irradiated to a photo resist layer on a wafer.

A semiconductor device comprises the wafer, a plurality of isolator layers, and a plurality of conductor layers interposed between adjacent ones of the isolator layers.

A semiconductor device has a central portion and a side portion. The central portion has first through (N+1)-th isolator layers and first through N-th conductor layers, where N represents an integer greater than one. The side portion has first through (M+1)-th isolator layers and first through M-th conductor layers, where M represents an integer greater than one.

The N-th conductor layer has an N-th upper surface having an N-th level. The M-th conductor layer has an M-th upper surface having an M-th level. In case where N is extremely greater than M, the N-th level is extremely higher than the M-th level. Namely, the N-th level is extremely different from the M-th level. As a result, a photo resist layer on the N-th conductor layer and the M-th conductor layer has a central surface and a side surface which is extremely lower than the central surface. Consequently, the pattern image on the photo resist layer is unclear.

SUMMARY OF THE INVENTION

It is therefore an object of this invention to provide an exposing device which is capable of making a clear pattern image on a photo resist layer having a central surface and a side surface which is extremely lower than the central surface.

Other objects of this invention will become clear as the description proceeds.

According to this invention, there is provided an exposing device which comprises (A) an illuminating source for projecting rays; (B) an illuminating optical system for receiving the rays to produce parallel rays; (C) a reticle having a pattern for receiving the parallel rays to produce a reticle pattern image representative of the pattern; (D) a reducing optical system for reducing the reticle pattern image to produce a reduced pattern image which is irradiated to a photo resist layer on a wafer; and (E) spherical aberration giving means for giving a negative longitudinal spherical aberration to the reduced pattern image.

DESCRIPTION OF THE PREFERRED EMBODIMENTS

Figure 1:
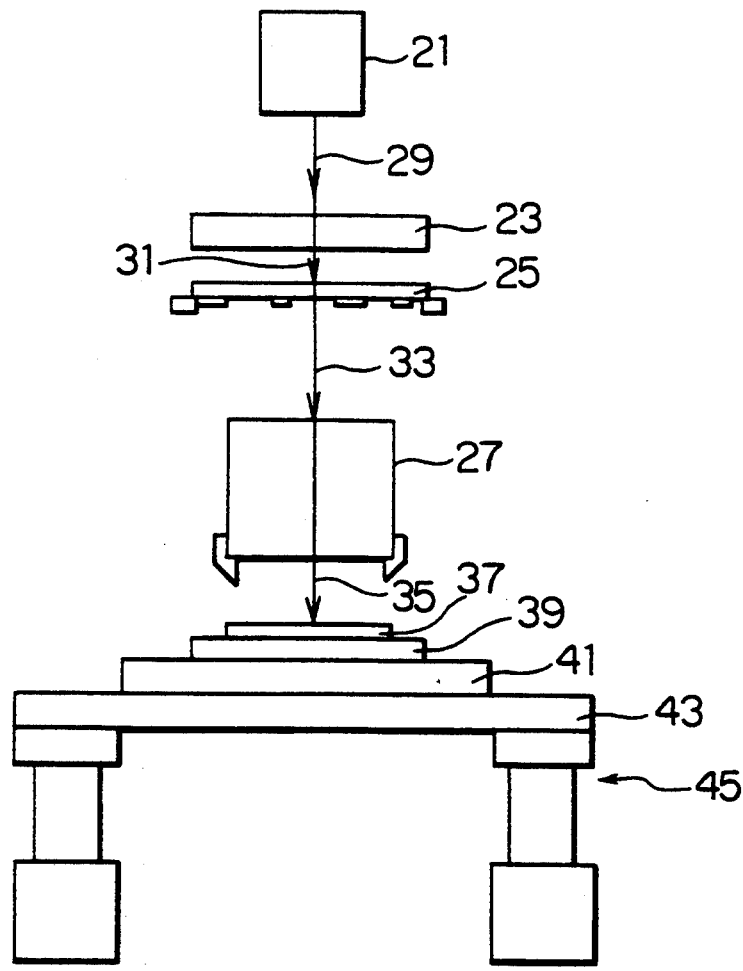
FIG. 1 is a schematic front view of a conventional exposing device.

Referring to FIG. 1, a conventional exposing device will first be described for a better understanding of this invention. The conventional exposing device comprises an illuminating source 21, an illuminating optical system 23, a reticle 25, and a reducing optical system 27.

The illuminating source 21 projects rays 29. The illuminating optical system 23 receives the rays 29 from the illuminating source 21 to produce parallel rays 31. The reticle 25 has a pattern. The reticle 25 receives the parallel rays 31 from the illuminating optical system 23 to produce a reticle pattern image 33 representative of the pattern. The reducing optical system 27 receives the reticle pattern image 33 from the reticle 23. The reducing optical system 27 reduces the reticle pattern image 33 to produce a reduced pattern image as a pattern image 35. The pattern image 35 is irradiated to a photo resist layer on a wafer 37.

The wafer 37 is attached on a wafer table 39. The wafer table 39 is attached on a stage 41. The stage 41 is supported to be movable in directions of an x-axis and a y-axis by a supporting table 43. The supporting table 43 is attached on a vibration insulation device 45.

Figure 2:
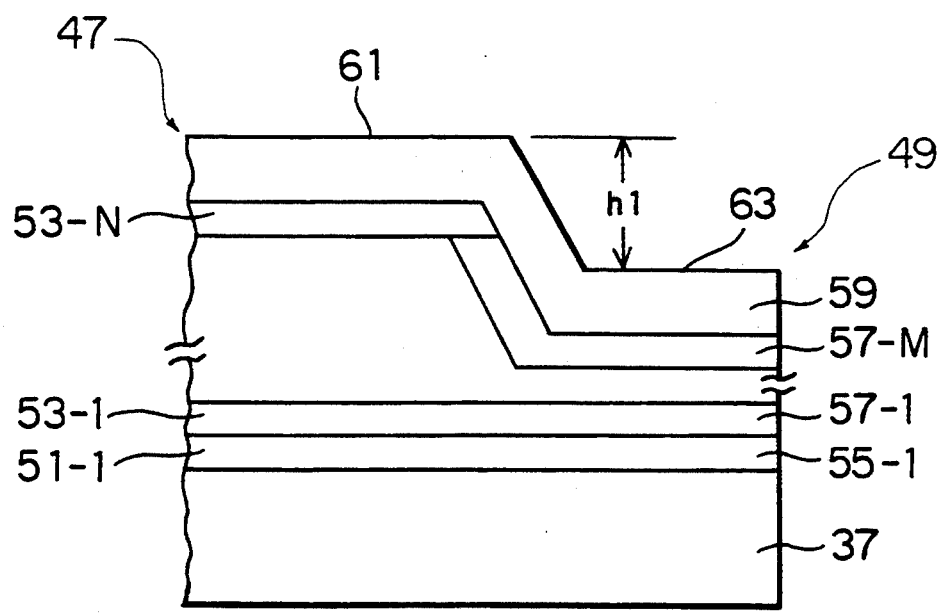
FIG. 2 is a schematic fragmentary end view of a semiconductor device exposed by the conventional exposing device illustrated in FIG. 1.

Referring to FIG. 2, a semiconductor device comprises a wafer 37, a central portion 47, and a side portion 49. The central portion 47 and the side portion 49 is formed on the wafer 37. The central portion 47 has first through (N+1)-th insulator layers 51-1–51-(N+1) and first through N-th conductor layers 53-1–53-N, where N represents an integer greater than one. The side portion 49 has first through (M+1)-th isolator layers 55-1–55-(M+1) and first through M-th conductor layers 57-1–57-M, where M represents an integer greater than one.

The N-th conductor layer 53-N has an N-th surface having an N-th level. The M-th conductor layer 57-M has an M-th upper surface having an M-th level. In case where N is extremely greater than M, the N-th level is extremely higher than the M-th level. As a result, a photo resist layer 59 on the N-th conductor layer 53-N and the M-th conductor layer 57-M has a central surface 61 and a side surface 63 which is extremely lower than the central surface 61 by a difference h1. Consequently, the pattern image 35 on the photo resist layer 59 is unclear.

Figure 3:
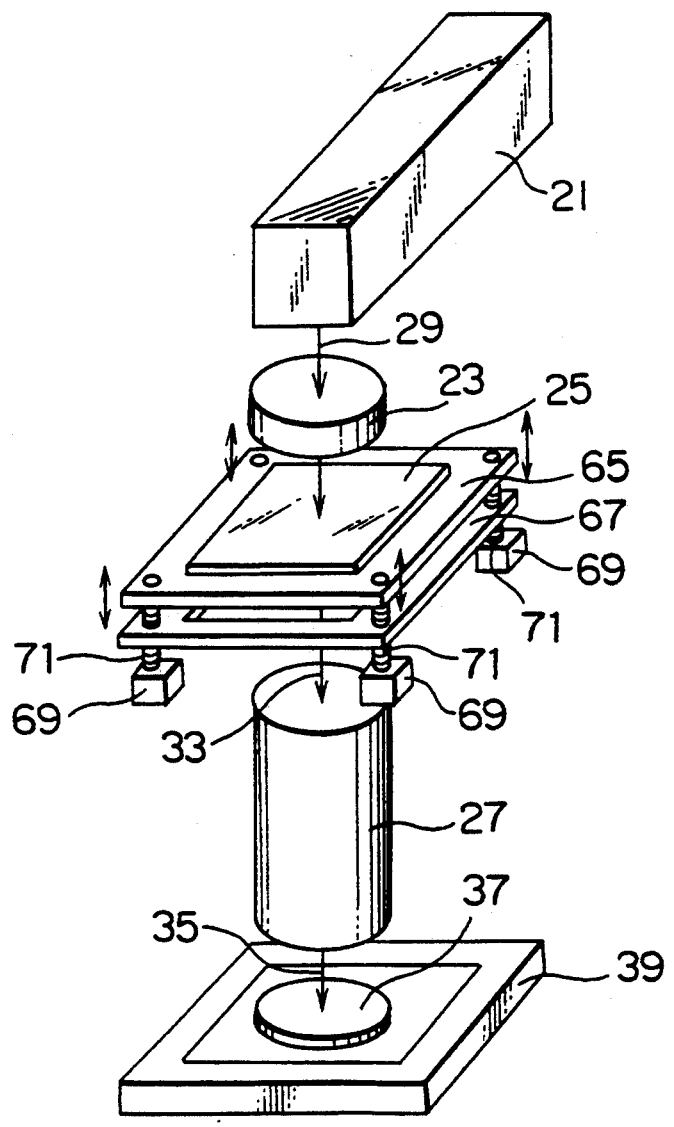
FIG. 3 is a schematic perspective view of an exposing device according to a first embodiment of this invention.

Referring to FIG. 3, the description will proceed to an exposing device according to a first embodiment of this invention. Similar parts are designated by like reference numerals.

The reticle 25 is attached on a reticle frame 65. A fixation frame 67 is placed under the reticle frame 65. Four motors 69 are placed under the fixation frame 67. Each of motors 69 has a rotating screw 71. The reticle frame 65 has four screw holes. The rotating screws 71 is fitted in the screw holes and support the reticle frame 65. When the rotating screws 71 are rotated by the motors 69, the reticle frame 65 and the reticle 25 is displaced in an optical axis relative to the reticle pattern image 33. A combination of the reticle frame 65, the fixation frame 67, the motors 69, and the rotating screws 71 serves as a spherical aberration giving unit for displaceably supporting the reticle 25 in the optical axis relative to the reticle pattern image 33 to give a negative longitudinal spherical aberration to the pattern image 35.

Figure 4:
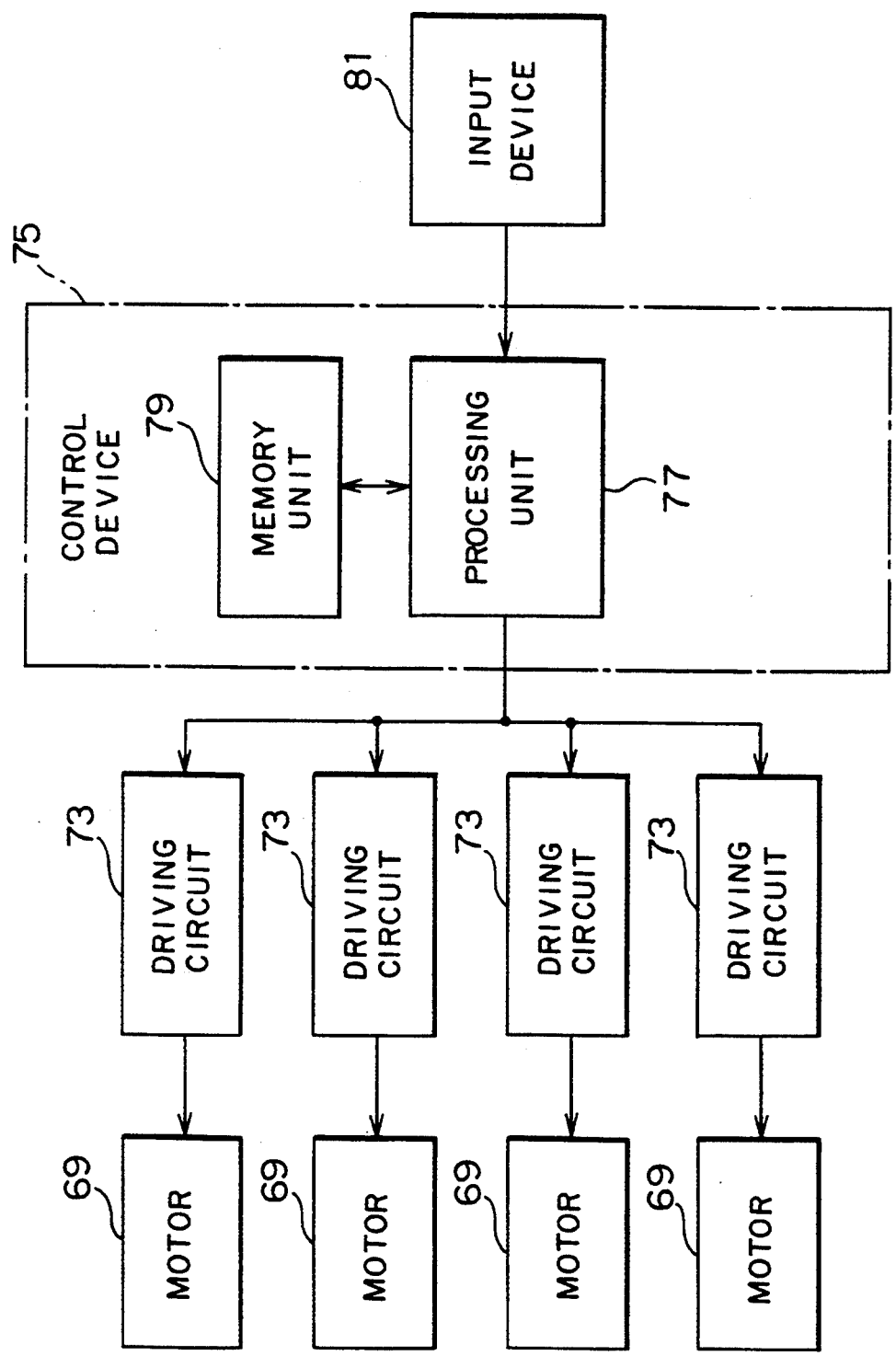
FIG. 4 is a block diagram of a control device for controlling motors of the exposing device illustrated in FIG. 3.

Referring to FIG. 4, the motors 69 are connected to driving circuits 73, respectively. The driving circuits 73 drive the motors 69, respectively. The driving circuits 73 are connected to a control device 75. The control device 75 controls the driving circuits 73. The control device 75 comprises a processing unit 77 and a memory unit 79 connected to the processing unit 77. The processing unit 77 is connected to the driving circuits 73 and an input device 81.

Figure 5:
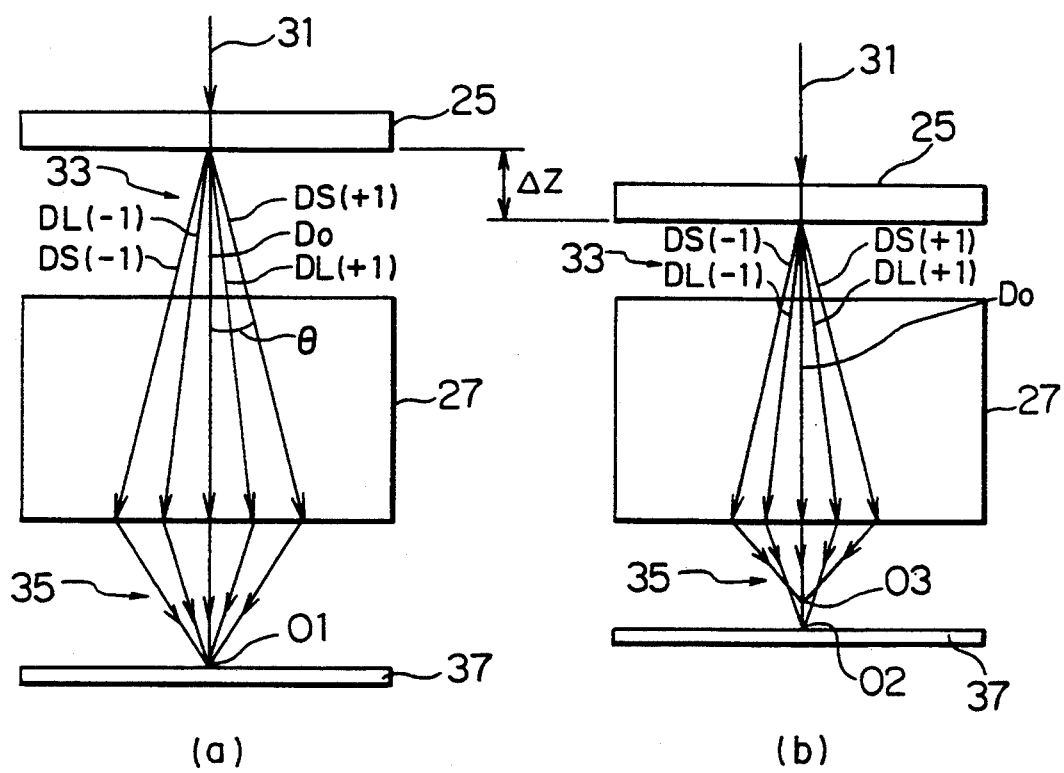
FIG. 5 is a view for use in describing operation of the exposing device illustrated in FIG. 3.

Referring to FIG. 5, operation of the exposing device will be described in detail.

The reticle pattern rays 33 comprise a primary ray D0 and secondary rays DL(+1) and DL(−1) or another secondary rays DS(+1) and DS(−1). It is assumed that $\theta$ represents an angle between the primary ray D0 and the secondary ray DL(+1), DL(−1), DS(+1), or DS(−1), $\theta$ is defined by a following equation (1).

$$\sin\theta = \lambda/P$$

In Equation (1), $\lambda$ represents a wavelength of the reticle pattern ray, P represents a pitch or size of a part in the pattern on the reticle 25. In case where P is large, $\theta$ becomes small.

In FIG. 5(a), in case where a spherical aberration is zero, the primary ray D0 and the secondary rays DL(+1), DL(−1), DS(+1), and DS(−1) reach at a first position O1.

In FIG. 5(b), in case where the reticle 25 is displaced by a distance $\Delta Z$ in the optical axis relative to the reticle pattern image 33 to give the negative longitudinal spherical aberration, the primary ray D0 and the secondary rays DL(+1) and DL(−1) reach at a second position O2. In this case, the secondary rays DS(+1) and DS(−1) reach at a third position O3 which is located between the position O3 and the reticle 25. Namely, the position O3 is nearer to the reticle 25 than the position O2.

On the other hand, the pattern on the reticle 25 has a central pattern portion and a side pattern portion. The central pattern portion has parts each of which has a small pitch or size. The side pattern portion has parts each of which has a large pitch or size larger than small pitch or size of the part in the central pattern portion. Consequently, the secondary rays DS(+1) and DS(−1) represent the central pattern portion. The secondary rays DL(+1) and DL(−1) represent the side pattern portion. In addition, the secondary rays DS(+1) and DS(−1) reach at the third position O3 nearer to the reticle 25 than the second position O2 which receives the secondary rays DL(+1) and DL(−1). As a result, the pattern image 35 is clear on the photo resist layer 61 (FIG. 2) which has the central surface 61 and a side surface 63 (FIG. 2) which is extremely lower than the central surface 61.

Figure 6:
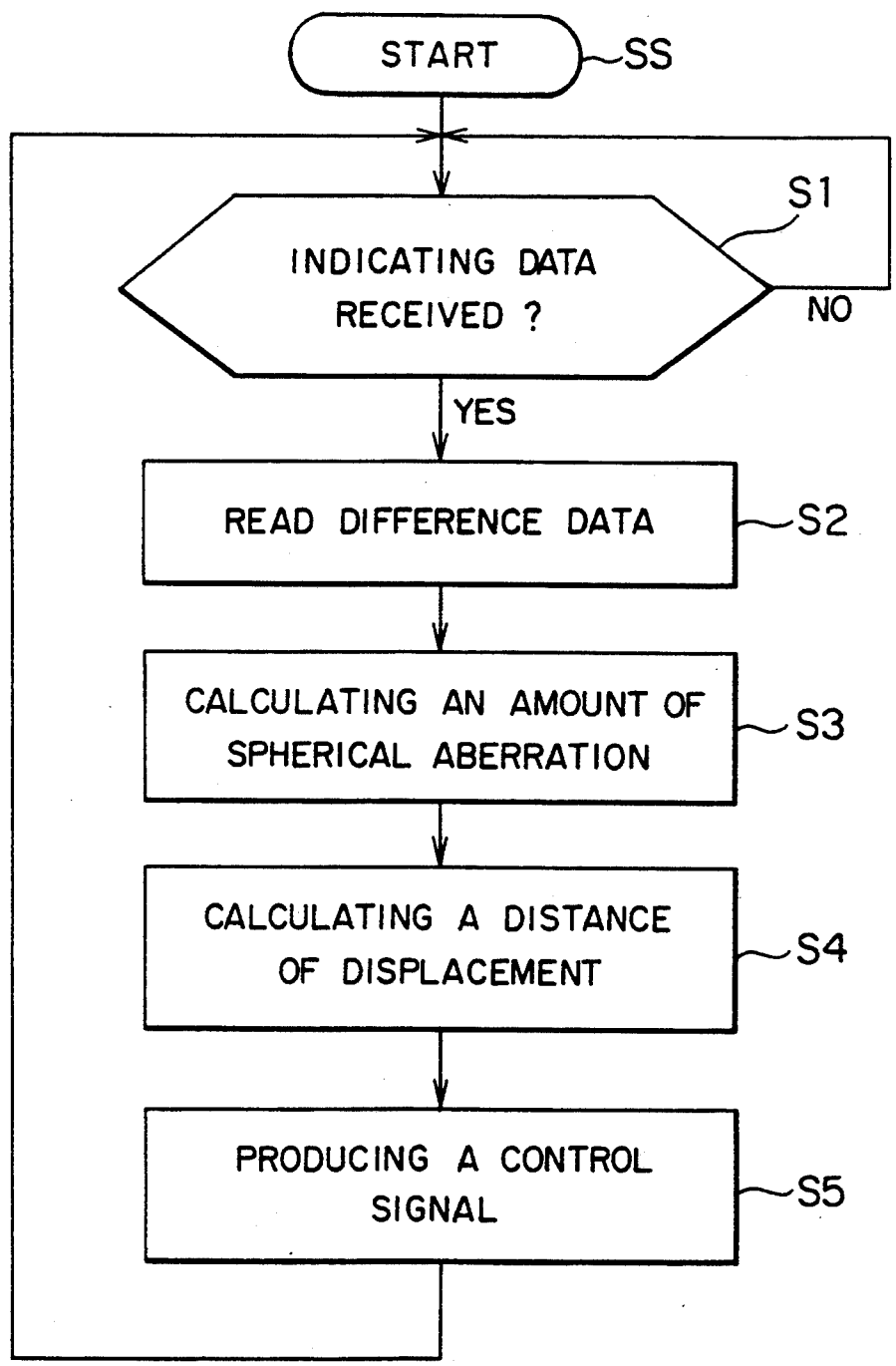
FIG. 6 is a simplified flow chart for use in describing operation of the exposing device illustrated in FIG. 3.

Referring to FIG. 6 together with FIG. 4, the operation of the control device 75 will be described in detail.

The exposing device is put into an initial state when a power source switch (not shown) of the exposing device is closed at a start stage SS. The start stage SS proceeds to a first stage S1 at which the control device 75 carries out an operation to discriminate whether or not the processing unit 77 receives indicating data which represents names of manufactured goods and production processes. The indicating data is inputted to the processing unit 77 by an operator by use of the input device 81. When the processing unit 77 receives the indicating data, the first stage S1 is followed by a second stage S2. Otherwise, the control device 75 returns to the initial state.

The memory device 79 memorizes different data which represents a difference between the central surface of the central portion 61 (FIG. 2) and the side surface of the side portion 63 (FIG. 2) in response to the indicating data. At the stage S2, the processing unit 77 reads the different data from the memory unit 79 in response to the indicating data.

A third stage S3 follows the second stage S2 to calculate an amount of negative longitudinal spherical aberration in response to the different data. A fourth stage S4 follows the third stage S3 to calculate a distance of displacement in response to the amount of negative longitudinal spherical aberration. A fifth stage S5 follows the fourth stage S4 to produce a control signal in response to the distance of displacement. At this time, the processing unit 77 supplies the control signal to the driving circuits 73. The driving circuits 77 drive, in response to the control signal, the motors 69 to displace the reticle 25 by the distance of displacement. The first stage S1 follows the fifth stage S5.

Figure 7:
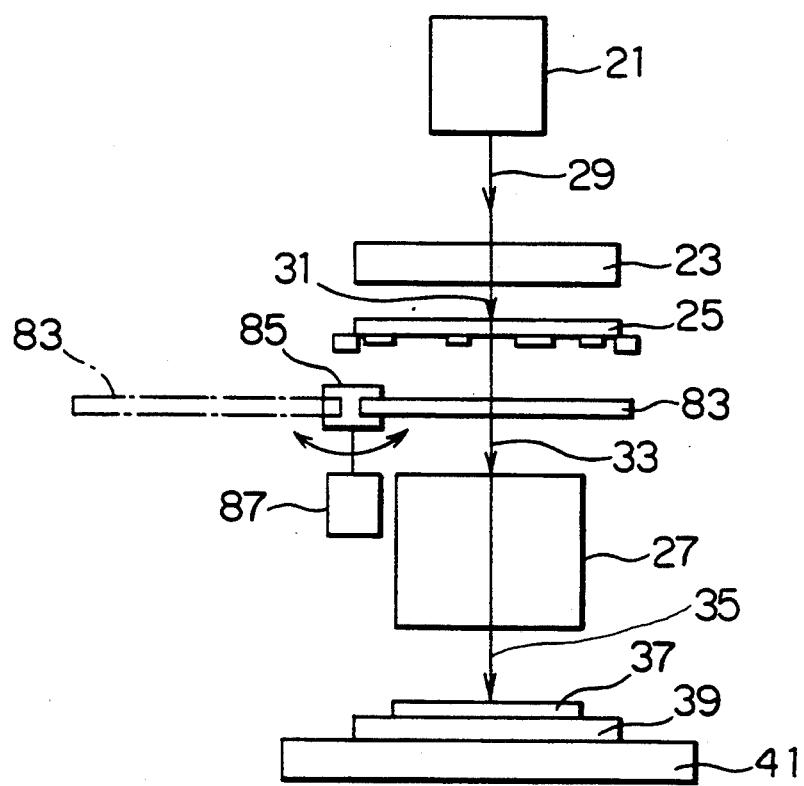
FIG. 7 is a schematic front view of an exposing device according to a second embodiment of this invention.

Referring to FIG. 7, the description will proceed to an exposing device according to a second embodiment of this invention. Similar parts are designated by like reference numerals.

A first transparent parallel-plate 83 is removably placed between the reticle 25 and the wafer 37. The first transparent parallel-plate 83 has a positive longitudinal spherical aberration to the pattern image 35. The first transparent parallel-plate 83 is supported by a supporting member 85. The supporting member 85 is rotatably supported by a supporting device (not shown). A motor 87 is capable of rotating the supporting member 85 and the first transparent parallel-plate 83. The motor 87 is capable of removing the first transparent parallel-plate 83 between the reticle 25 and the wafer 37.

When the first transparent parallel-plate 83 is placed between the reticle 25 and the wafer 37, the first transparent parallel-plate 83 gives the positive longitudinal spherical aberration to the reticle pattern image 35. In this case, the pattern image 35 has a longitudinal spherical aberration which is equal to zero. When the first transparent parallel-plate 83 is removed between the reticle 25 and the wafer 37, the pattern image 35 has a negative longitudinal spherical aberration. The positive longitudinal spherical aberration given by the first transparent parallel-plate 83 is determined by material and thickness of the first transparent parallel-plate 83. The first transparent parallel-plate 83 is made of, for example, quartz.

Figure 8:
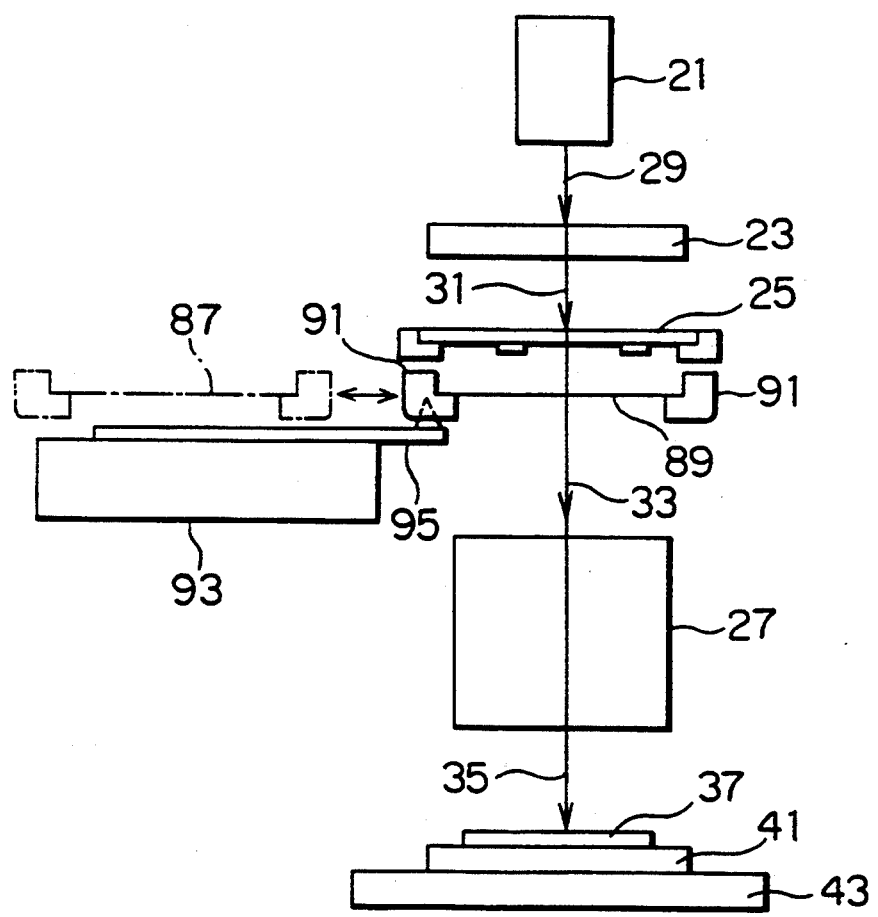
FIG. 8 is a schematic front view of an exposing device according to a third embodiment of this invention.

Referring to FIG. 8, the description will proceed to an exposing device according to a third embodiment of this invention. Similar parts are designated by like reference numerals.

A second transparent parallel-plate 89 is movably placed between the reticle 25 and the wafer 37. The second transparent parallel-plate 89 has a negative longitudinal spherical aberration to the pattern image 35. The second transparent parallel-plate 89 is supported by a supporting member 91. The supporting member 91 is movably supported by a supporting device (not shown). A motor 93 is capable of moving a rod 95 which is connected to the supporting member 91. The rod 95 is capable of moving the supporting member 91 and the second transparent parallel-plate 89.

When the second transparent parallel-plate 89 is removed between the reticle 25 and the wafer 37, the pattern image 35 has a longitudinal spherical aberration which is equal to zero. When the second transparent parallel-plate 89 is placed between the reticle 25 and the wafer 37, the second transparent parallel-plate 89 gives the negative longitudinal spherical aberration to the pattern image 35. The negative longitudinal spherical aberration given by the second transparent parallel-plate 89 is determined by material and thickness of the second transparent parallel-plate 89. The second transparent parallel-plate 89 is made of, for example, cellulose dielectric, polypropylene, fluorite, or quartz.

What is claimed is:

1. An exposing device comprising:
   an illuminating source for projecting rays;
   an illuminating optical system for receiving said rays to produce parallel rays;
   a reticle having a pattern for receiving said parallel rays to produce a reticle pattern image representative of said pattern;
   a reducing optical system for reducing said reticle pattern image to produce a reduced pattern image which is irradiated to a photo resist layer on a wafer; and
   spherical aberration giving means for giving a negative longitudinal spherical aberration to said reduced pattern image.

2. An exposing device as claimed in claim 1, wherein said spherical aberration giving means comprises a supporting unit for displaceably supporting said reticle in an optical axis relative to said reticle pattern image.

3. An exposing device as claimed in claim 1, wherein said spherical aberration giving means comprises a transparent parallel-plate which has a positive longitudinal spherical aberration to said reduced pattern image and which is removably placed between said reticle and said wafer.

4. An exposing device as claimed in claim 1, wherein said spherical aberration giving means comprises a transparent parallel-plate which has a negative longitudinal aberration to said reduced pattern image and which is movably placed between said reticle and said wafer.

* * * * *